United States Patent [19]
Ward et al.

[11] Patent Number: 5,221,967
[45] Date of Patent: Jun. 22, 1993

[54] SIGNAL QUALITY MONITORING SYSTEM

[75] Inventors: Rabab K. Ward; Qin Zhang, both of Vancouver, Canada

[73] Assignee: The University of British Columbia, Vancouver, Canada

[21] Appl. No.: 696,945

[22] Filed: May 8, 1991

[51] Int. Cl.⁵ .................. H04N 17/00; G06K 9/00
[52] U.S. Cl. ................................... 358/139; 382/43
[58] Field of Search ............... 358/160, 139; 382/17, 382/43, 48; 364/576

[56]  References Cited
U.S. PATENT DOCUMENTS

| | | | |
|---|---|---|---|
| 4,351,062 | 9/1982 | Yoshiya | 375/99 |
| 4,558,358 | 12/1985 | Onda | 358/86 |
| 4,630,228 | 12/1986 | Tarczy-Hornoch et al. | 364/576 |
| 4,633,411 | 12/1986 | Bliss et al. | 364/481 |
| 4,843,631 | 6/1989 | Steinpichler et al. | 382/43 |
| 4,901,147 | 2/1990 | Tajima | 358/139 |
| 5,047,724 | 9/1991 | Boksiner et al. | 324/520 |
| 5,073,822 | 12/1991 | Gumm et al. | 358/139 |

Primary Examiner—Leo H. Boudreau
Assistant Examiner—David R. Anderson
Attorney, Agent, or Firm—C. A. Rowley

[57] ABSTRACT

A cable television signal for example may be monitored and impairments determined and in many cases classified by grabbing at least portion of a transmitted frame of video information somewhere on the network to provide a video signal, performing a two dimensional Fourier transform on the video signal and analyzing the Fourier transform so obtained to determine the location of areas indicating above average occurrence of specific frequencies to provide an indication of an impairment.

5 Claims, 5 Drawing Sheets

SIGNAL QUALITY MONITORING SYSTEM

FIELD OF THE INVENTION

The present invention relates to a system for signal quality monitoring. More particularly the present invention relates to a system for monitoring a cable television signal using image analyses.

BACKGROUND OF THE PRESENT INVENTION

The quality of cable t.v. pictures is of great concern to cable companies as well as to their viewers. These cable networks carry dozens of television channel signals and programs into millions of homes by transmitting the signal along a transmission line, amplifying the signal at various locations along the system to maintain the strength and quality of the transmitted signal as close as possible to the signal being transmitted at the head end or transmitting station.

There are many opportunities for extraneous signals to be picked up in line. Such impairment may arise form a variety of different sources. For example, intermodulation problems generally appear on the screen as diagonal bands that may be either narrow or quite broad depending on relationship of the intermodulation frequency with the frequency of the picture carrier. Composite triple beat impairment has video characteristics of graininess or texture effect over the entire picture. These are generally caused by overdriven cable amplifiers.

Another common problem with television transmission via cable networks is snow noise which is generally caused by a weak signal which results in a poor (small) carrier t noise ratio. Faults in the cable transmission system itself such as poor cable splices, badly coupled cable connections, or impedance which mismatch in the cable system may also result in noise.

Yet another common problem with cable t.v. reception is power line interference which appears as horizontal lines on the television screen.

No automatic television picture quality monitoring system has been available to cable television suppliers and it is believed there is no known adequate system for monitoring.

The concept of applying a Fourier transform to a signal is not new. This has been practised for many years in a variety of different industries. Similarly two dimensional Fourier transforms have been used. For example, as taught in U.S. Pat. No. 4,843,631 where it is used for pattern recognition in a pattern recognition process which, in order to locate an image content or a portion of an original image which is identical with a reference pattern, the received reference pattern or a two diminsional Fourier transform thereof is compared to the image content or portion in respect of size and orientation by inverse rotary extension with the ascertained twist angle of enlargement factor to find the position or positions at which the reference pattern when converted in that way has maximum identity with a section of the image.

BRIEF DESCRIPTION OF THE PRESENT INVENTION

It is an object of the present invention to provide a cable television picture monitoring system to detect signal impairment affecting the picture quality received by subscribers.

It is a further object of the present invention to provide an image processing system for analyzing a selected video frame or portion thereof to determine the quality of the signal used to generate the frame at or near the location where the frame is to be seen.

Broadly the present invention relates to a signal quality monitoring system comprising grabbing at least a portion of a selected transmitted frame of video information transmitted form a head end at a monitoring station away from said head-end to provide a video frame signal performing a two dimensional Fourier transform of at least a selected area of said video frame signal to obtain a two dimensional Fourier transform of amplitude versus horizontal and vertical spacial frequencies, analyzing said two dimensional Fourier transform to determine areas having above average occurrence of specific frequencies to provide an indication of signal impairments included in said selected area of said video frame signal.

Preferably said steps will be repeated periodically on a routine basis to provide continuing detailed information of the signal at said monitoring station.

Preferably said transform is provided at said head end and used to alert repairmen as to the signal at the monitoring station.

It is also possible to subtract form the video frame signal, the corresponding video frame signal as transmitted form the head end to form an impairment signal and then perform a two dimensional Fourier transform on the impairment signal to provide indications of impairments and types of impairments.

BRIEF DESCRIPTION OF THE DRAWINGS

Further features, objects and advantages will be evident from the following detailed description of the preferred embodiments of the present invention taken in conjunction with the accompanying drawings in which.

DESCRIPTION OF THE PREFERRED EMBODIMENTS

Figure 1:
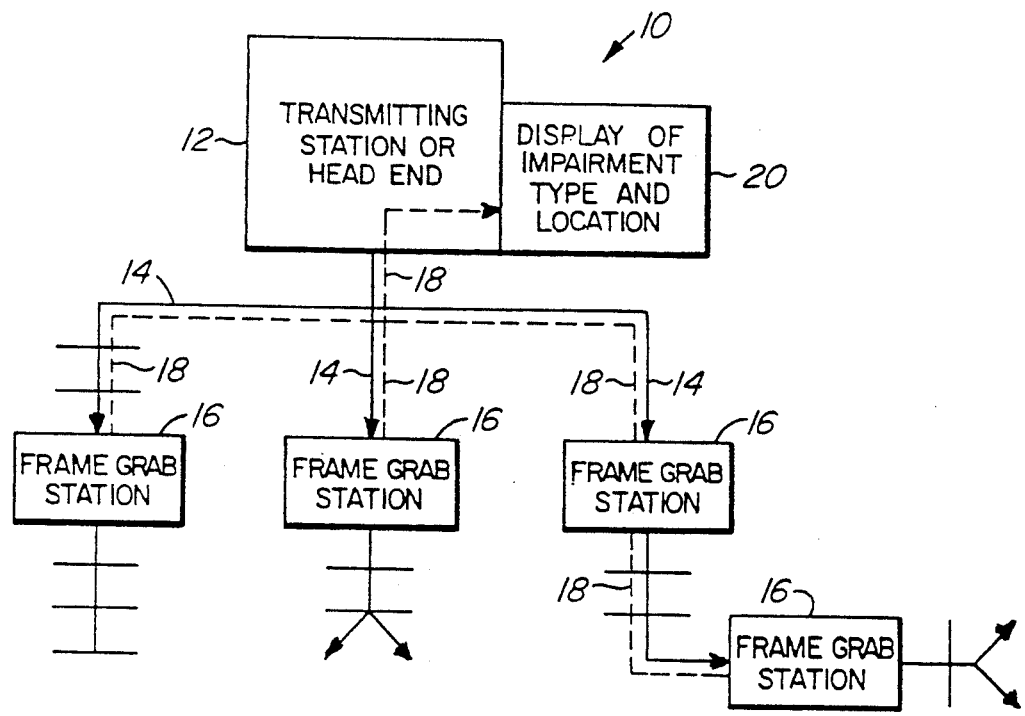
FIG. 1 is a schematic illustration of a transmission system for cable television incorporating the present invention.
Figure 2:
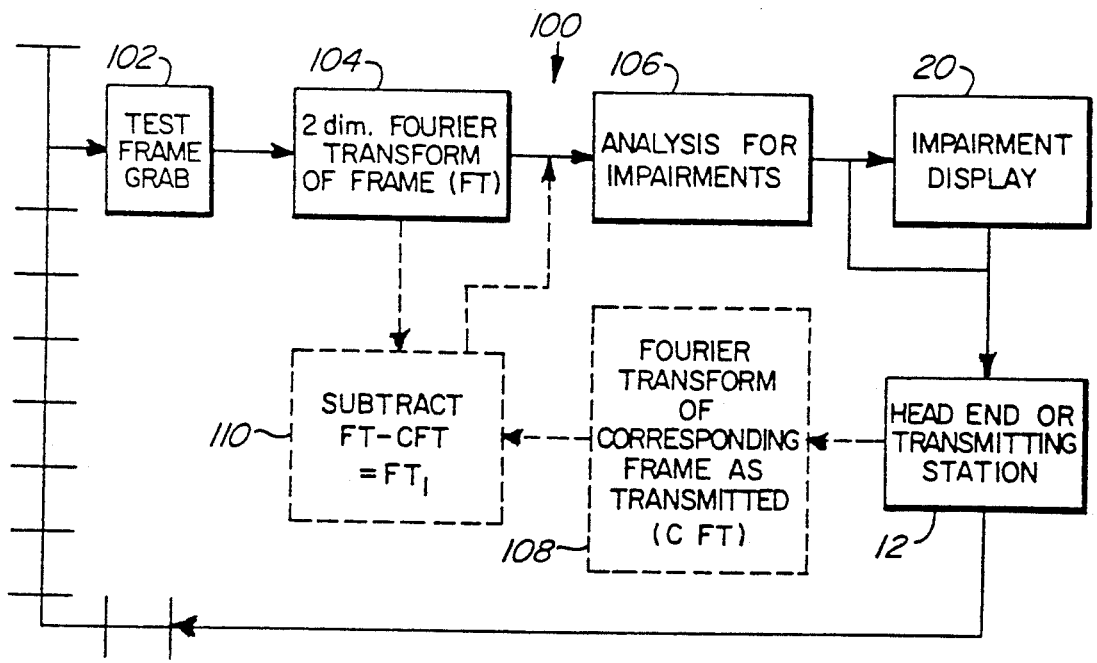
FIG. 2 is a schematic illustration of the monitoring system of the present invention.

Before describing the invention please note that all Figures of two diminsional Fourier transforms exhibit amplitudes of the transforms verses horizontal and verticals spatial frequencies The present invention is generally indicated in FIGS. 1 and 2 with the cable transmitting system indicated in FIG. 1 at 10 and the signal quality monitoring system 100 in FIG. 2.

The cable system is generally composed of a transmission station or head end 12 which transmits via a sign transmission line 14, television signals for a plurality of different channels to a plurality of different location, i.e. users homes and the like where the televise picture is viewed.

As above indicated impairments creep into the transmitted signal for various reasons and at various positions along the transmission path as defined by the transmission conductor systems represented by the lines 14. Frame grabber or monitoring stations as indicated 16 are provided at selected locations in the transmission system formed by the lines 14. These monitoring or frame grab stations 16 periodically grab a selected video frame signal being transmitted along the line 14 at that particular location to provide a video frame signal to be subjected to analyses.

The frame grab station 16 may perform various operations on the video frame signal or may recode the video frame signal and return it to the head end for processing or may carry out all of the processing at the station 16 and code and transmit only the end results or findings back to the head end for further processing and display, i.e. the monitoring station 16 must be physically located at particular locations along the transmission path 14 for the signal however, image processing of the grabbed image may be performed wherever is most suitable, it being important that the information be communicated to the required location where it can be used which normally will be at the head end 12. Thus the frame grab or monitoring station 16 transmits information as indicated bay the dotted lines 18 back to the head end so that the impairments and their locations can be displayed as indicated on the display module 20.

Reference to FIG. 2 indicating the monitoring system 100 has a frame grab 102 that forms part of the frame grab monitoring station 16 there being a separate frame grab 102 in each of the stations. The frame so grabbed is then subject to the formation of a two dimensional Fourier transform (FT) as indicated at 104. This Fourier transform FT is analyzed for impairments as indicated at 106 and then a suitable signal transmitted to the impairment display 20 which is substantially equivalent to the impairment display of FIG. 1. If desired the two dimensional Fourier transform may simply be displayed together with the location from which is is received.

It was initially believed that it would be necessary to carry on the actions indicated in the dash lines in FIG. 2 namely that a Fourier transform of the corresponding frame to that grabbed by the test frame grabber 102 as transmitted would have to be obtained as indicated at 108, i.e. the Fourier transform of the frame as transmitted (designated as CFT) would have to be determined and then a step of subtraction of FT from CFT to provide the Fourier transform $FT_1$ (i.e. $FT - CFT = FT_1$) would have to be performed as indicated by the box 110 and this modified Fourier transform $FT_1$ would have to be submitted for analyses as indicated at 106 and displayed via the display 20.

The development of the present invention is illustrated in the remaining figures.

Figure 3:
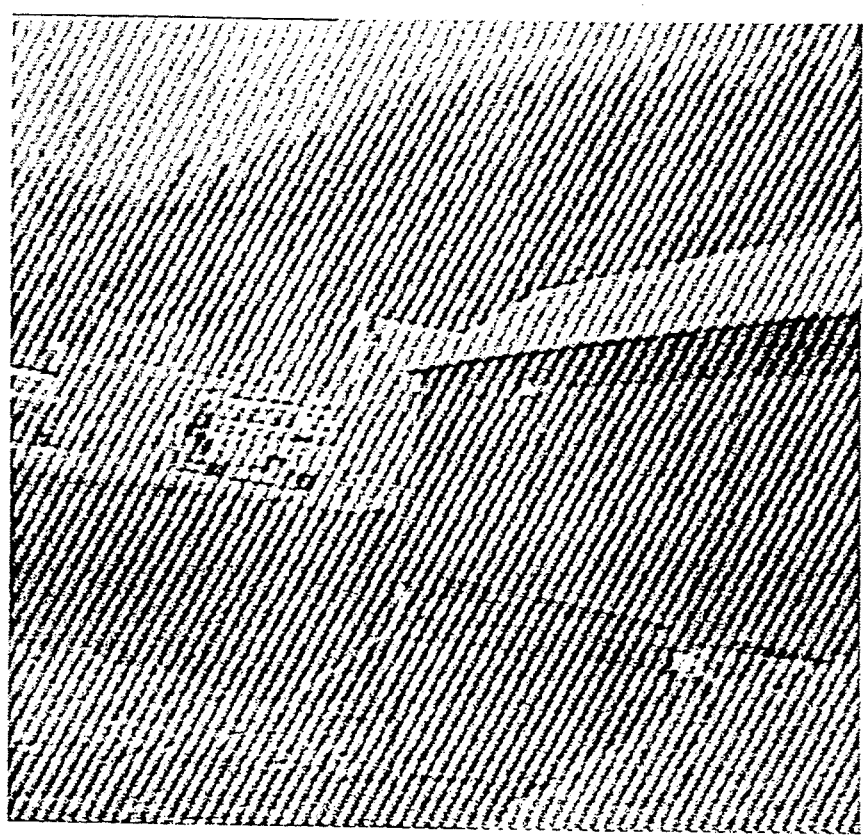
FIG. 3 is an illustration of a picture or frame impaired by intermodulation with a signal to noise ratio of 40 decibels.
Figure 4:
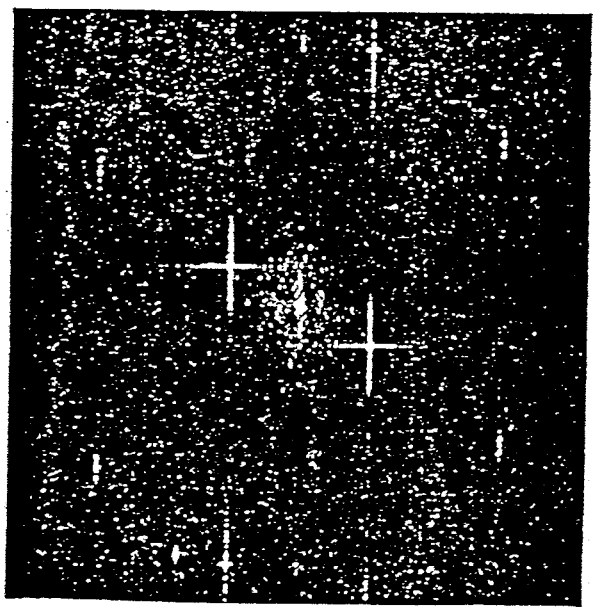
FIG. 4 is a two dimensional Fourier transform of impairments of the picture in FIG. 3 obtained by subtracting the original image form the impaired image.

FIG. 3 illustrates a typical picture being impaired by an intermodulation having a signal to noise ratio of about 40 decibels. This signal in the original concept of the present invention was produced and a two dimensional Fourier transform of the original signal without the intermodulation, i.e. as transmitted, was obtained as indicated at 108 and the two transforms were then subtracted to result in modified Fourier transform as indicated at 110 in FIG. 2. The modified Fourier transform so obtained is indicated in FIG. 4, which it will be apparent includes a plurality of space irregularities. These irregularities always occur in groups, each group comprising a pair of pulses symmetrically positioned around the original and located on the same vertical line. and the position of the irregularities provides an indication of the type of irregularity, while the size of the irregularity indicates the severity of the irregularity or signal imparment.

Figure 5:
FIG. 5 shows the signal with snow noise having a signal to noise ratio of 33 decibels and FIG. 6 is two dimension Fourier spectra of the impairment obtained by subtracting the original image from the impaired image.
Figure 6:
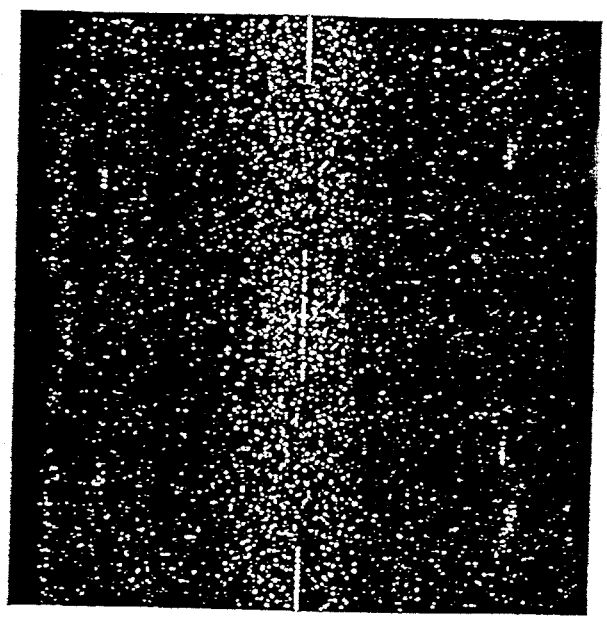

FIG. 5 shows a television picture that has been impaired by snow noise having signal to noise ratio of 33 decibels and FIG. 6 is a modified Fourier transform $FT_1$ similar to FIG. 4 but of the picture of FIG. 5, i.e. the Fourier transform for the picture of FIG. 5 was produced and the Fourier transform for the picture of FIG. 5 as transmitted was produced and then subtracted from the other which results in the modified Fourier transform of FIG. 6. It will be noted that the impairment of snow appears as substantially a vertical band of spaced dots.

It will be apparent that both FIGS. 4 and FIG. 6 show that impairments are distinguishable in the modified Fourier transform which are shown in plain view.

The above technique requires that two corresponding signals be used which for accuracy required that a known signal be be transmitted without disturbing the viewer and that this known frame be grabbed at the station 16 and used in the process which makes this process difficult to carry out, particularly commercially.

Figure 7:
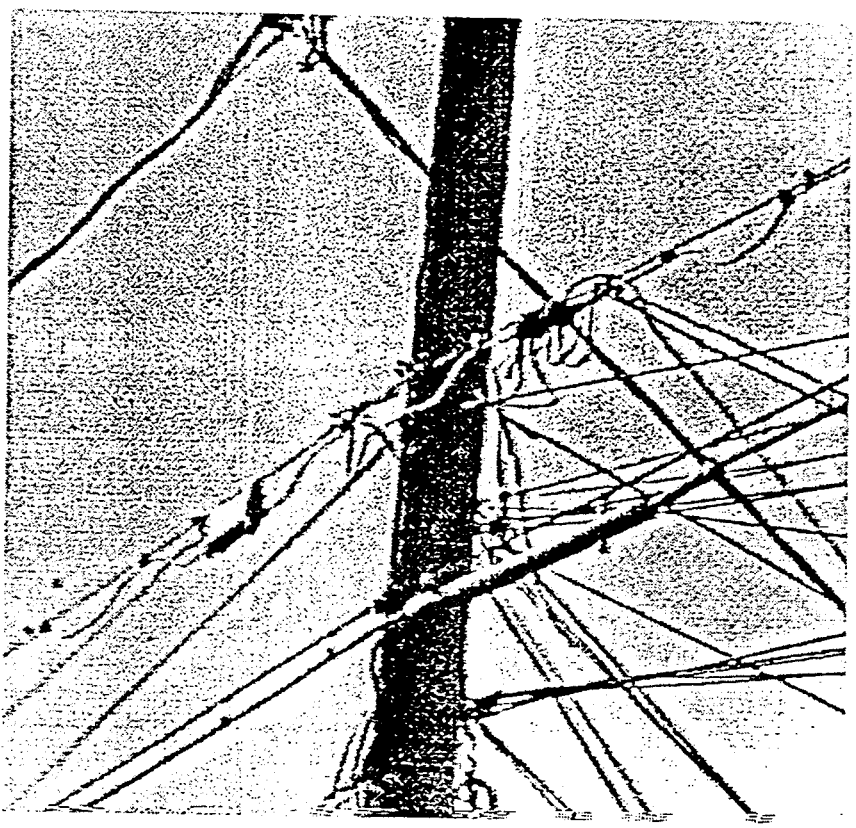
FIG. 7 illustrates a substantially normal image.
Figure 8:
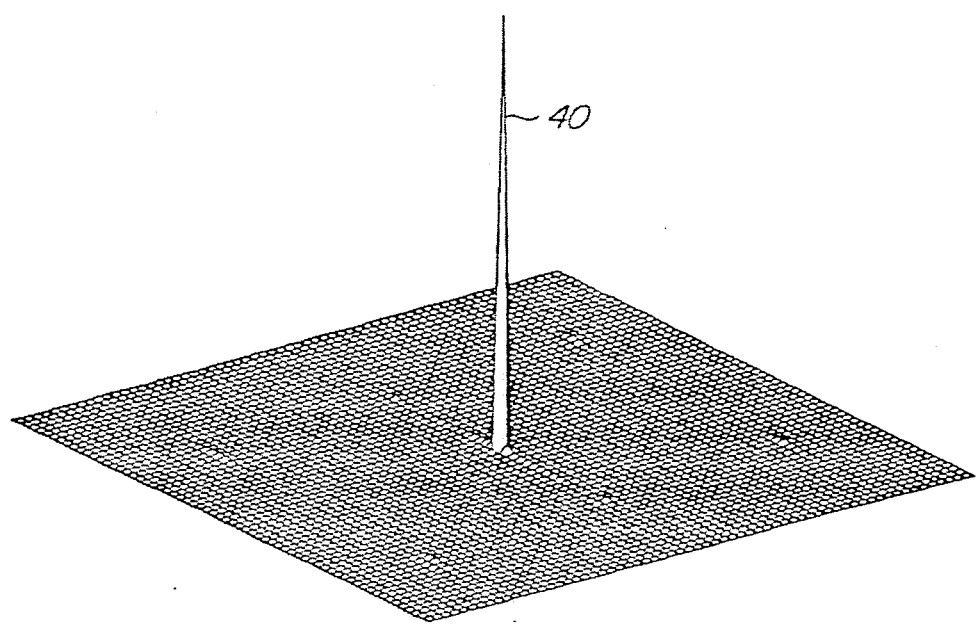
FIG. 8 is a two dimensional Fourier transform of the grabbed picture of FIG. 7.

As the invention developed, a Fourier transform was made of a non-impaired signal, particularly a Fourier transform as indicated in FIG. 8 was made based on the picture shown in FIG. 7 wherein the picture in FIG. 7 was relatively clean and had few, if any, impairments.

It will be noted that the two dimensional Fourier transform of FIG. 8 shows a low frequency spike 40 substantially in the middle of the Fourier transform. It has been found that similar spikes are generally found when most frames are transmitted and that the position of this spike does not materially affect the disposition of the spikes formed by impairments to the picture, thus the step of subtracting the two dimension Fourier transform of the originally transmitted image was determined not to be essential.

Figure 9:
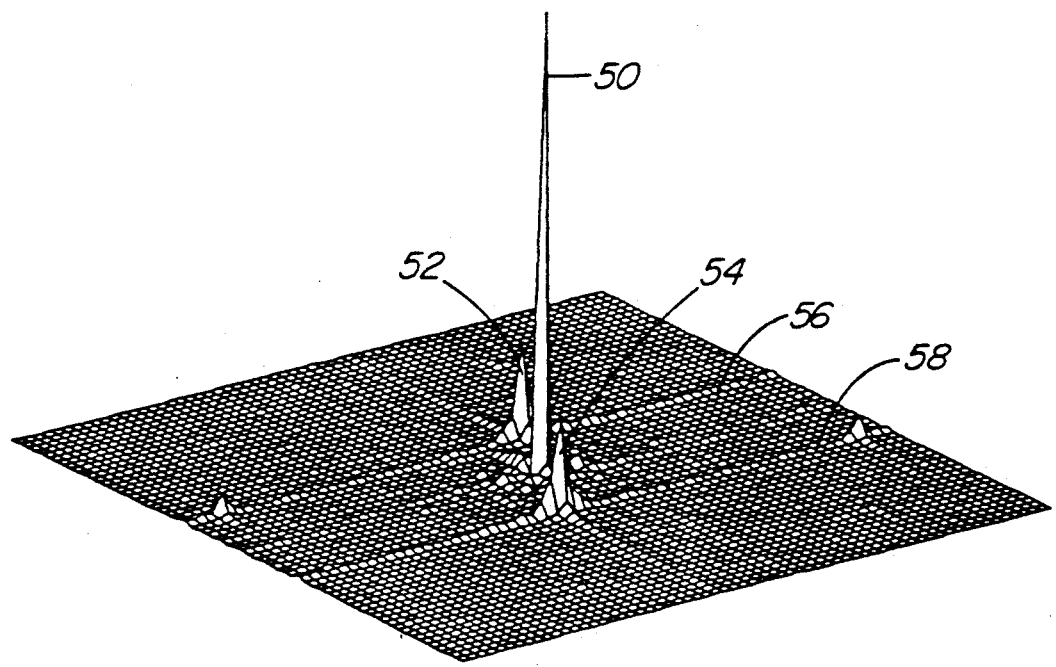
FIG. 9 is a two dimensional Fourier transform of the actual picture or frame of FIG. 3 without the subtraction of the frame as originally transmitted.

FIG. 9 shows a two dimensional Fourier transform for the picture illustrated in FIG. 3. It will be noted that the central spike remains as indicated at 50 and that two small peaks indicated at 52 and 54 symmetrically positioned relative to the peak 50 are generated and that vertical lines of modified frequencies are formed as indicated at 56 and 58.

Figure 10:
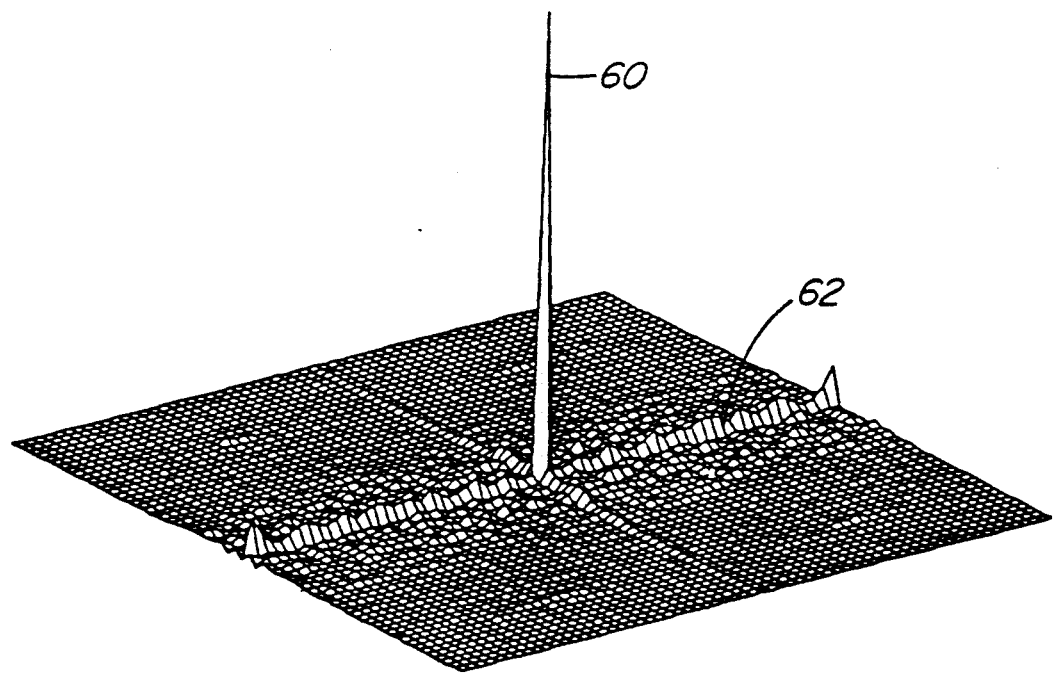
FIG. 10 is a two dimension Fourier transform of the actual picture or frame as shown in FIG. 5 without the subtraction of the frame as originally transmitted.

The two dimensional Fourier transform illustrated in FIG. 10 which corresponds to a Fourier transform of the picture or frame illustrated in FIG. 5 has the similar spike 60 which is common to substantially all normal pictures plus a band of frequency disturbances as indicated at 62 along a line of high and low frequencies (signal frequencies) and at a preselected range.

It will thus be apparent that the analysis of the two dimensional Fourier transfer of the grabbed signal frame may be used to determine impairments and that each impairment results in a different distortion of the two dimensional Fourier transform which thereby permits classification of the impairment to facilitate the work of the repairman.

It will be apparent that by providing a separate code for each of the monitoring station locations where the impairment is discovered can be pinpointed and by the use of the two dimensional Fourier transform the actual type of impairment and the extent of the impairment may also be defined.

Having described the invention, modifications will be evident to those skilled in the art without departing form the spirit of the invention as defined in the appended claims.

We claim:

1. A signal quality monitoring method for determining impairments in the quality of a signal as received at a monitoring station comprising transmitting a video signal from a head-end, grabbing at least a portion of a transmitted frame of video information transmitted from said head-end as a portion of said video signal at said monitoring station spaced away from said head-end to provide a video frame signal, performing a two dimensional Fourier transform of at least a portion of said video frame signal to obtain a two dimension Fourier transform of amplitudes versus horizontal and vertical spatial frequencies, analyzing said two dimensional Fourier transform to determine areas on said transform depicting above average occurrence of specific frequencies and indicating impairments in said video frame signal and thereby provide an indication of specific signal impairments included in said video frame signal and the quality of said video frame signal at said monitoring station.

2. A method as defined in claim 1 wherein said steps of grabbing, performing a two dimensional Fourier transform and analyzing are repeated to provide continuing detailed information of the video information at said monitoring station.

3. A method as defined in claim 1 wherein said transform or said indication of specific signal impairments is transmitted to said head-end and used to alert repairmen as to the signal at the monitoring station.

4. A method as defined in claim 2 wherein said transform or said indication of specific signal impairments is transmitted to said head-end and used to alert repairmen as to the signal at the monitoring station.

5. A method as defined in claim 1 further comprising forming a two dimensional Fourier transform of said video signal as transmitted from said head-end and corresponding to said video frame signal, subtracting said corresponding Fourier transform from said Fourier transform of said video frame signal to form a modified two dimensional Fourier transform and analyzing said modified Fourier transform to provide indications of impairments and types of impairments to said video frame signal as at said monitoring station.

* * * * *